United States Patent
Kimura

(10) Patent No.: US 9,431,273 B2
(45) Date of Patent: Aug. 30, 2016

(54) METHOD FOR MANUFACTURING A RESIN-ENCAPSULATED SEMICONDUCTOR DEVICE

(71) Applicant: SEIKO INSTRUMENTS INC., Chiba-shi, Chiba (JP)

(72) Inventor: Noriyuki Kimura, Chiba (JP)

(73) Assignee: SII SEMICONDUCTOR CORPORATION (JP)

( * ) Notice: Subject to any disclaimer, the term of this patent is extended or adjusted under 35 U.S.C. 154(b) by 0 days.

(21) Appl. No.: 14/960,658

(22) Filed: Dec. 7, 2015

(65) Prior Publication Data

US 2016/0086826 A1  Mar. 24, 2016

Related U.S. Application Data

(62) Division of application No. 14/174,579, filed on Feb. 6, 2014, now Pat. No. 9,275,972.

(30) Foreign Application Priority Data

Feb. 12, 2013 (JP) ................. 2013-024972

(51) Int. Cl.
| | | |
|---|---|---|
| *H01L 21/00* | (2006.01) | |
| *H01L 21/56* | (2006.01) | |
| *H01L 23/00* | (2006.01) | |
| *H01L 23/31* | (2006.01) | |
| *H01L 23/495* | (2006.01) | |
| *H01L 21/78* | (2006.01) | |

(52) U.S. Cl.
CPC ............ *H01L 21/561* (2013.01); *H01L 21/563* (2013.01); *H01L 21/568* (2013.01); *H01L 21/78* (2013.01); *H01L 23/3107* (2013.01); *H01L 23/49548* (2013.01); *H01L 23/49551* (2013.01); *H01L 23/49582* (2013.01); *H01L 24/89* (2013.01); *H01L 24/83* (2013.01); *H01L 24/85* (2013.01); *H01L 2224/29099* (2013.01); *H01L 2224/32245* (2013.01); *H01L 2224/451* (2013.01); *H01L 2224/48247* (2013.01); *H01L 2224/83005* (2013.01); *H01L 2224/85005* (2013.01); *H01L 2224/92247* (2013.01); *H01L 2224/97* (2013.01); *H01L 2924/00014* (2013.01); H01L 2924/181 (2013.01); *H01L 2924/1815* (2013.01)

(58) Field of Classification Search
CPC ............... H01L 2224/48247; H01L 2224/97; H01L 23/28; H01L 21/568; H01L 2224/83005; H01L 2224/85005; H01L 2224/92247; H01L 23/3107; H01L 23/49551; H01L 23/49582
See application file for complete search history.

(56) References Cited

U.S. PATENT DOCUMENTS

| | | | |
|---|---|---|---|
| 6,143,981 A | 11/2000 | Glenn | 174/534 |
| 7,262,491 B2 | 8/2007 | Islam et al. | 257/670 |
| 8,049,311 B2 * | 11/2011 | Lim | H01L 21/568 257/659 |
| 2005/0248259 A1 | 11/2005 | Chang | 313/498 |
| 2009/0294950 A1 * | 12/2009 | Itou | H01L 21/4828 257/690 |
| 2011/0198737 A1 | 8/2011 | Yao et al. | 257/659 |
| 2011/0227208 A1 * | 9/2011 | Kim | H01L 21/4832 257/676 |
| 2014/0084435 A1 | 3/2014 | Kimura | 257/676 |

\* cited by examiner

FOREIGN PATENT DOCUMENTS

WO  9967821  12/1999

*Primary Examiner* — Khiem D Nguyen
(74) *Attorney, Agent, or Firm* — Adams & Wilks

(57) ABSTRACT

A resin-encapsulated semiconductor device includes a semiconductor element mounted on a die pad portion, a plurality of lead portions arranged so that leading end portions thereof are opposed to the die pad portion, and thin metal wires for connecting together electrodes of the semiconductor element and the lead portions. Those members are partially encapsulated by a resin. A bottom surface part of the die pad portion and a lead bottom surface part, an outer surface part, and an upper end part of the lead portion are exposed from the encapsulation resin. After a cutout part devoid of the encapsulation resin is formed above a lead upper end part, a plating layer is formed on the lead bottom surface part and the lead upper end part.

6 Claims, 11 Drawing Sheets

(a)

1 UNIT (b)

CUTTING LINE   CUTTING WIDTH

CUTTING LINE

METHOD FOR MANUFACTURING A RESIN-ENCAPSULATED SEMICONDUCTOR DEVICE

CROSS-REFERENCE TO RELATED APPLICATION

This application is a divisional of U.S. application Ser. No. 14/174,579, filed Feb. 6, 2014 and now U.S. Pat. No. 9,275,972, which is hereby incorporated by reference in its entirety.

BACKGROUND OF THE INVENTION

1. Field of the Invention

The present invention relates to non-lead type resin-encapsulated semiconductor device referred to as QFN or DFN, and a method of manufacturing the same. In particular, the present invention relates to a resin-encapsulated semiconductor device including a lead terminal portion that is improved in mounting reliability, and a method of manufacturing the same.

2. Description of the Related Art

In recent years, in order to respond to miniaturization of electronic equipment, high-density mounting of semiconductor components has been demanded. Along therewith, the semiconductor components are more miniaturized and thinned. As well as BGA and CSP packages, DFN and QFN type semiconductor devices are now in practical use as small-sized packages that use a lead frame.

FIG. 5A is a rearview of a related-art DFN package, and FIG. 5B is a cross-sectional view taken along the line A-A of FIG. 5A. In the DFN package, a plurality of lead portions 13 and a semiconductor element 11 mounted on a die pad portion 12 are encapsulated by an encapsulation resin 16, and the lead portions 13 and the die pad portion 12 are exposed from a rear surface of the package. The plurality of lead portions 13 are arrayed in two opposing directions on the rear surface of the package, and those lead portions form external leads. Further, the plurality of lead portions 13 are electrically connected to a surface electrode of the semiconductor element 11 via thin metal wires 14 inside the encapsulation resin 16.

In the DFN package, the plurality of lead portions 13 does not protrude outside from the resin 16, and hence the DFN package has an advantage in that the mounting area to a circuit board can be reduced. Further, by exposing the die pad portion 12 from the encapsulation resin 16, heat generated inside can be efficiently dissipated to the outside. Note that, there is another DFN package having a structure in which the die pad portion 12 is encapsulated inside the encapsulation resin 16. A QFN package has a structure in which external leads are exposed in four directions at the rear surface of the package.

FIG. 6 is a top view of a frame after resin encapsulation as viewed from above, followed by FIG. 7 as a cross-sectional view taken along the line B-B of the frame illustrated in FIG. 6. As illustrated in FIGS. 6 and 7, the following method has been adopted. That is, the semiconductor elements 11 mounted on the respective die pad portions 12 within the frame are encapsulated by the encapsulation resin 16, and then the encapsulation resin 16 and the lead portions 13 are simultaneously cut along cutting lines by a rotary blade of a dicing device. In this manner, as illustrated in FIG. 8, individual semiconductor devices are singulated (for example, see International Publication No. WO 99/67821 (FIG. 7)).

In this type of resin-encapsulated semiconductor device, the individual semiconductor devices are obtained by cutting positions of the lead portions 13 by the rotary blade after resin encapsulation and separating the semiconductor devices from the frame. However, the lead portions 13 are cut from the frame to be formed, and hence, as illustrated in FIG. 9, an end surface of a cut part of the lead portion 13 is not covered with a plating layer 17. When the semiconductor device is bonded to a circuit board 20 such as a printed board with use of solder 18, a solder fillet due to the solder 18 is not formed on a side surface part of the lead portion 13, which is exposed from the encapsulation resin portion. There is therefore a risk in that mounting strength weakens and mounting reliability lowers.

Mounting of the semiconductor device to the circuit board 20 is described with reference to the drawings. FIG. 9 is an enlarged view of an inside of a circle illustrated in FIG. 8, which illustrates the lead portion 13 of the semiconductor device. The plating layer 17, which is formed on other outer surfaces of the lead portion 13, is absent on an end surface part of the lead portion 13 that is subjected to lead cutting and is exposed from the encapsulation resin 16. Accordingly, a solder fillet is not formed on the end surface part of the lead portion 13 when the semiconductor device is mounted onto the circuit board 20 with a bonding agent such as the solder 18, as illustrated in FIG. 10 as a schematic cross-sectional view of the mounted state in an enlarged manner, which leads to reduction in mounting strength.

When a formation of a solder fillet on and over the end surface part of the lead portion 13 is necessary to gain a larger mounting strength, the end surface part and the upper surface portion of the lead portion 13 is protruded from the encapsulation resin 16, for example, as illustrated in FIG. 11 of an enlarged schematic cross-sectional view of the mounted state. The structure gives a larger mounting strength but the width between the right lead portion and left lead portion on the drawing becomes wider, decreasing the merit of a small package.

SUMMARY OF THE INVENTION

The present invention has been made to solve the above-mentioned problem, and provides a semiconductor device and a method of manufacturing the same that are capable of improving strength in circuit board mounting and enhancing mounting reliability of a DFN or QFN type resin-encapsulated semiconductor device.

In order to solve the above-mentioned problem, the following measures are employed.

First, there is provided a resin-encapsulated semiconductor device, including: a die pad portion: a semiconductor element mounted on the die pad portion, a plurality of lead portions arranged so as to be opposed to the die pad portion; thin metal wires for connecting together the plurality of lead portions and a plurality of electrodes of the semiconductor element; and an encapsulation resin for encapsulating the die pad portion, the semiconductor element, and the plurality of lead portions in a manner that the plurality of lead portions are partially exposed. The plurality of lead portions each include a lead bottom surface part that is a bottom surface exposed from the encapsulation resin, a lead outer surface part that is a leading end, and a lead upper end part that is a part of an upper surface. The lead bottom surface part is flush with a bottom surface of the encapsulation resin. The lead bottom surface part and the lead upper end part each have a plating layer thereon. The encapsulation resin is present vertically above the lead upper end part via a cutout part devoid of the encapsulation resin.

Further, in the resin-encapsulated semiconductor device, the lead outer surface part is protruded outwardly with respect to a side surface of the encapsulation resin.

Further, in the resin-encapsulated semiconductor device, the lead outer surface part is flush with a side surface of the encapsulation resin.

Further, in the resin-encapsulated semiconductor device, the plating layer formed on the lead bottom surface part and the plating layer formed on the lead upper end part each include one of a metal layer made of any one of metals of lead, bismuth, tin, copper, silver, palladium, and gold, and an alloy layer made of a metal alloy of at least two metals of lead, bismuth, tin, copper, silver, palladium, and gold.

Further, in the resin-encapsulated semiconductor device, the cutout part has a U-shape.

Further, in the resin-encapsulated semiconductor device, the die pad portion has a bottom surface part exposed from the encapsulation resin.

Further, in the resin-encapsulated semiconductor device, the plurality of lead portions each include an inner lead part and an outer lead part, and the plurality of lead portions are each bent so that the inner lead part is higher than the outer lead part.

Further, the following method is employed. Specifically, there is provided a method of manufacturing a resin-encapsulated semiconductor device, including: preparing one of a frame and an electroformed substrate including a plurality of units each including, as one unit, a die pad portion and a plurality of lead portions arranged so as to be opposed to the die pad portion; attaching a sealing sheet to a first surface of the one of the frame and the electroformed substrate; forming a soluble film on a second surface of each of the plurality of lead portions, which is on an opposite side to the first surface; mounting a semiconductor element to the die pad portion of the one of the frame and the electroformed substrate; connecting together the plurality of lead portions and electrodes on a surface of the semiconductor element by thin metal wires; encapsulating the die pad portion, the semiconductor element, and the plurality of lead portions by an encapsulation resin so that a lead bottom surface part of the each of the plurality of lead portions is exposed; dissolving and removing the soluble film to form a hollow portion; immersing the one of the frame and the electroformed substrate into a plating bath to form a plating layer on the lead bottom surface part and a lead upper end part of the each of the plurality of lead portions; subjecting the plurality of lead portions to first cutting from the first surface side to form a first groove that reaches the hollow portion; and subjecting the encapsulation resin to second cutting from the second surface side opposite to the first surface side to separate a resin-encapsulated semiconductor device from the one of the frame and the electroformed substrate.

Further, in the method of manufacturing a resin-encapsulated semiconductor device employed herein, the first cutting is punch cutting, and the second cutting is rotary blade cutting.

Further, in the method of manufacturing a resin-encapsulated semiconductor device employed herein, the first cutting is punch cutting, and the second cutting is also punch cutting.

Further, in the method of manufacturing a resin-encapsulated semiconductor device employed herein, the first cutting is rotary blade cutting, and the second cutting is punch cutting.

Further, in the method of manufacturing a resin-encapsulated semiconductor device employed herein, a cutting width by the rotary blade cutting is larger than a cutting width by the punch cutting, and is smaller than a width of the hollow portion.

Then, in the method of manufacturing a resin-encapsulated semiconductor device employed herein, a cutting width by the rotary blade cutting is the same as a cutting width by the punch cutting, and is smaller than a width of the hollow portion.

With use of the above-mentioned measure, when the resin-encapsulated semiconductor device according to one embodiment of the present invention is bonded with solder to a land portion of a circuit board such as a printed board, a solder fillet is formed up to the plating layer of the lead upper end part provided to the lead portion, and hence the mounting strength can be improved and the mounting reliability can be enhanced. Further, a solder fillet with a satisfactory shape is formed on a lead end surface part during board mounting, and hence recognition accuracy at the time of visual inspection of the bonded portion after mounting can be improved. Thus, misrecognition can be prevented.

BRIEF DESCRIPTION OF THE DRAWINGS

FIGS. 2A to 2K illustrate a method of manufacturing resin-encapsulated semiconductor device according to one embodiment of the present invention, in which FIG. 2A is a top view and FIGS. 2B to 2K are cross-sectional views.

DETAILED DESCRIPTION OF THE INVENTION

Now, a resin-encapsulated semiconductor device and a method of manufacturing the same according to embodiments of the present invention are described with reference to the drawings.

First, a frame according to an embodiment of the present invention is described.

Figure 1:
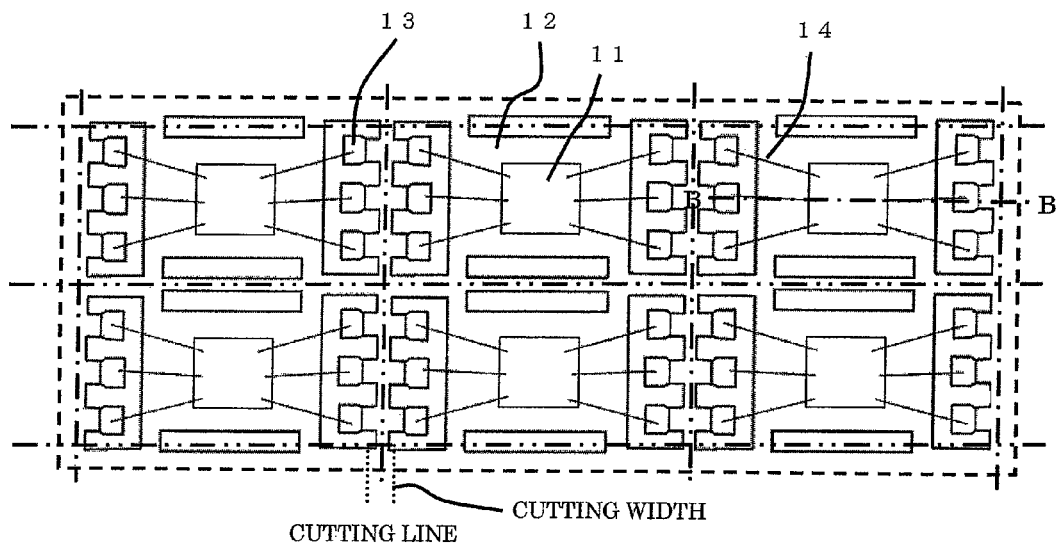
FIG. 1 is a top view of a frame having semiconductor elements mounted thereon according to one embodiment of the present invention.
Figure 2A:
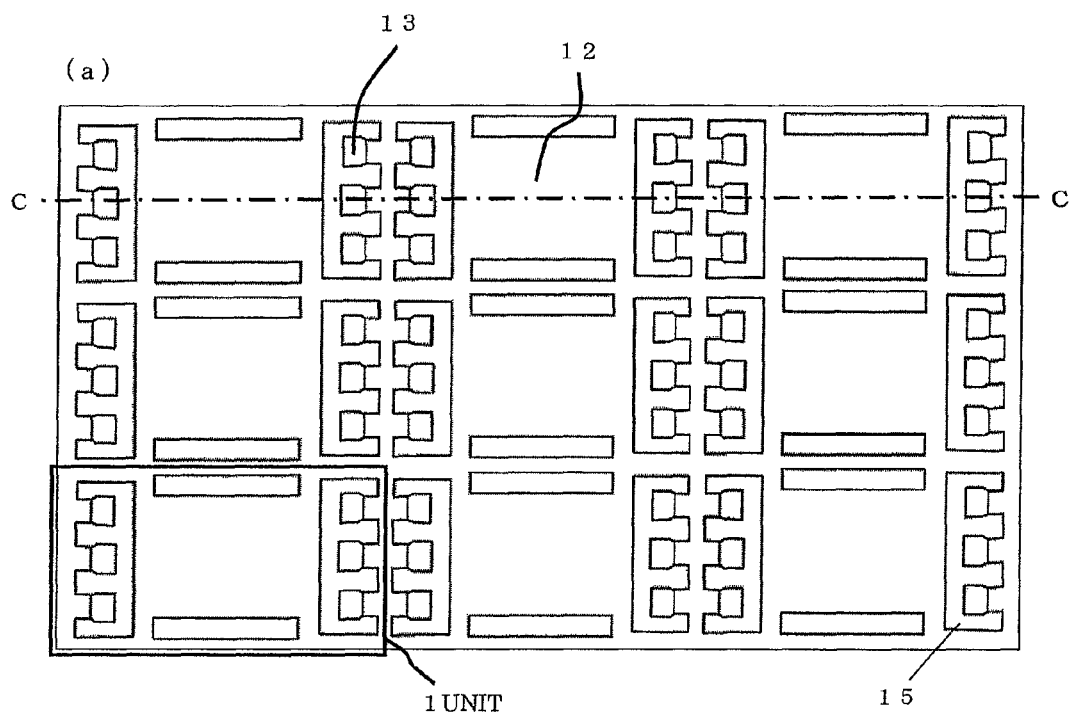

FIG. 1 is a top view of a frame or an electroformed substrate having semiconductor elements mounted thereon according to this embodiment, FIG. 2A is a frame top view before the semiconductor elements are mounted, and FIGS. 2B to 2K are cross-sectional views illustrating a method of manufacturing a semiconductor device. The frame is made of a copper (Cu) material, and as illustrated in FIG. 1, the semiconductor device of this embodiment includes a plurality of units each including, as one unit, a semiconductor element 11 mounted on a die pad portion 12, and a plurality of lead portions 13 arranged so that leading end portions thereof are opposed to the die pad portion 12. Broken lines in FIG. 1 indicate a region encapsulated by an encapsulation resin 16 when the semiconductor elements 11 are mounted to constitute resin-encapsulated semiconductor devices. Further, two-dot chain lines indicate cutting lines for separating the respective semiconductor devices after mounting the semiconductor elements 11, performing resin encapsulation, and forming the resin-encapsulated semiconductor devices.

Figure 3:
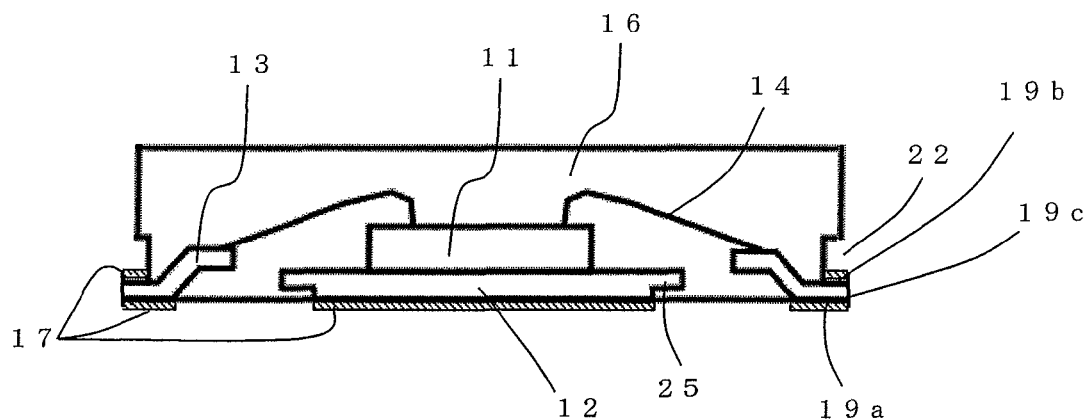
FIG. 3 is a cross-sectional view illustrating a resin-encapsulated semiconductor device according to one embodiment of the present invention.

Next, the resin-encapsulated semiconductor device of this embodiment is described. FIG. 3 is a view illustrating a single resin-encapsulated semiconductor device manufactured with use of the frame illustrated in FIG. 1, and FIG. 4 is a cross-sectional view taken along the line B-B represented in the upper right of FIG. 1.

As illustrated in FIG. 3, the semiconductor element 11 is mounted on the die pad portion 12 of the frame, and an electrode on the semiconductor element 11 and an inner lead part of the lead portion 13 are electrically connected to each other by a thin metal wire 14. The lead portion 13 includes an inner lead part and an outer lead part, and is bent so that the inner lead part is higher than the outer lead part. Further, the semiconductor element 11 on the die pad portion 12, the thin metal wire 14, and the lead portion 13 are encapsulated by the encapsulation resin 16. A rear surface of the die pad portion 12, which is on the opposite side to a surface on which the semiconductor element 11 is mounted, is exposed from the encapsulation resin 16, and the exposed surface is covered with a plating layer 17. The plating layer 17 is made of anyone of metals of lead, bismuth, tin, copper, silver, palladium, and gold, or an alloy of a plurality of the metals, and is formed by an electrolytic plating method or a non-electrolytic plating method. The die pad portion 12 has, at an end surface thereof, a thin part 25 in which the thickness of the die pad is reduced, to thereby achieve a structure that prevents the die pad portion 12 from slipping out from the encapsulation resin 16 because the encapsulation resin 16 is allowed to flow around the rear surface of the thin part 25.

The inner lead part of the lead portion 13 is encapsulated by the encapsulation resin 16. A lead bottom surface part 19a of the outer lead part, which is flush with the rear surface of the die pad portion 12 and a bottom surface of the encapsulation resin 16, is exposed from the encapsulation resin 16, and the exposed surface is covered with the plating layer 17. The encapsulation resin 16 has a U-shaped cutout part 22 at a side surface thereof so as to expose a lead upper end part 19b of the outer lead part of the lead portion 13. The plating layer 17 is also formed on the lead upper end part 19b of the outer lead part so as to cover the lead upper end part 19b. The leading end of the lead is a lead outer surface part 19c at which the lead is cut, which is not plated.

Figure 4:
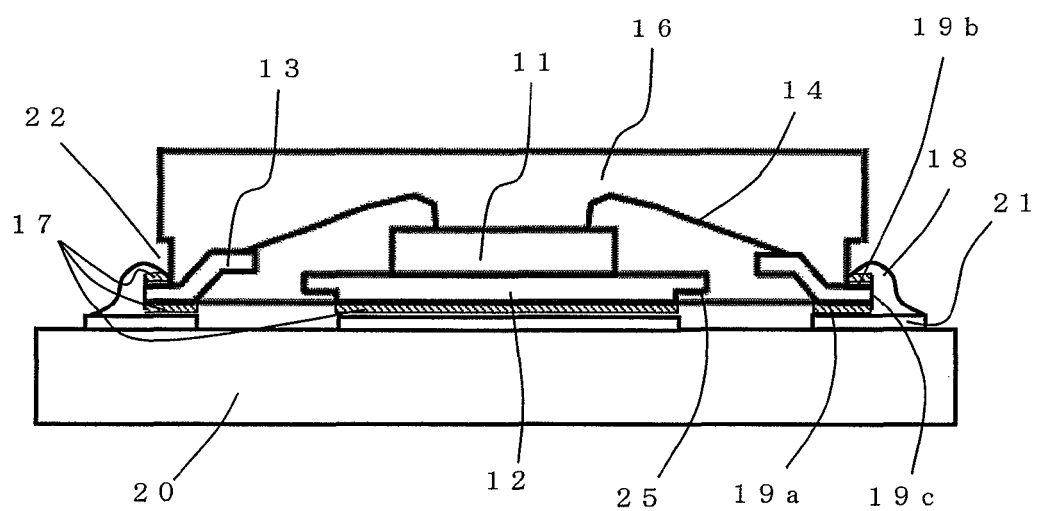
FIG. 4 is a cross-sectional view (mounting state enlarged view) illustrating the resin-encapsulated semiconductor device according to one embodiment of the present invention.
Figure 5A:
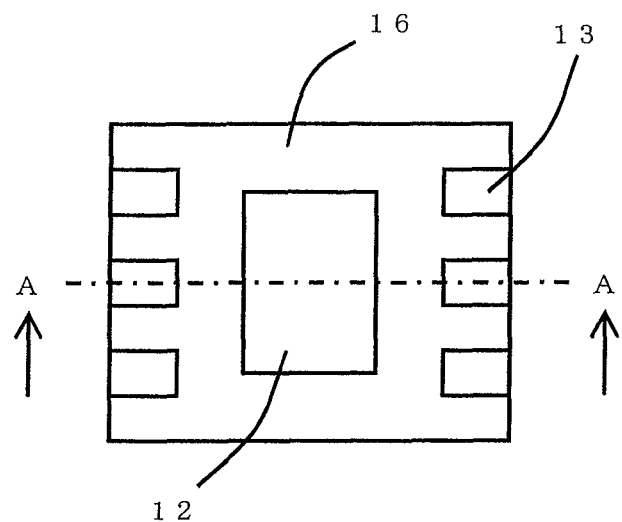
FIGS. 5A and 5B are views illustrating a related-art resin-encapsulated semiconductor device.
Figure 5B:
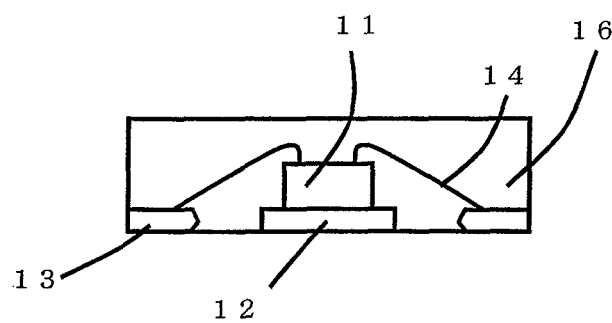
Figure 6:
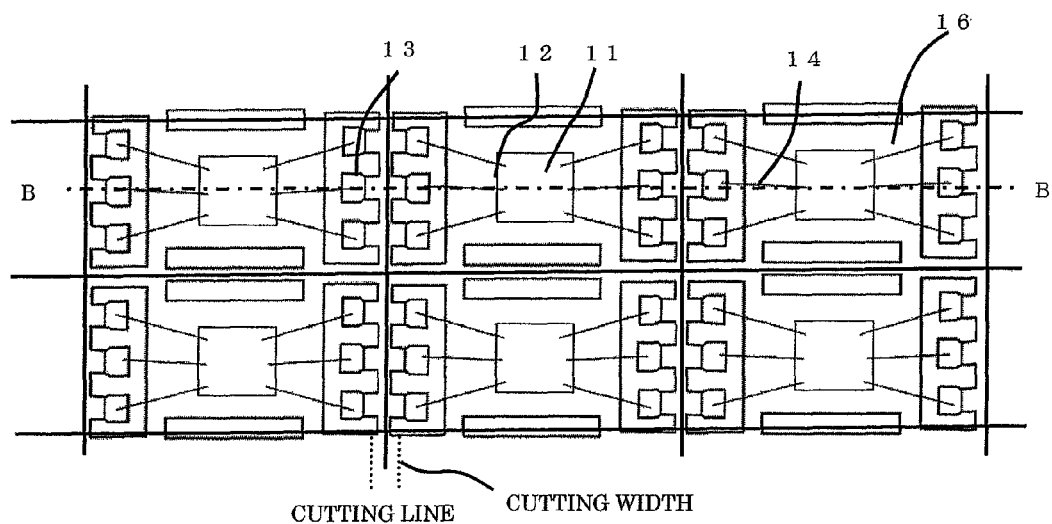
FIG. 6 is a frame top view illustrating a related-art method of manufacturing a resin-encapsulated semiconductor device.
Figure 7:
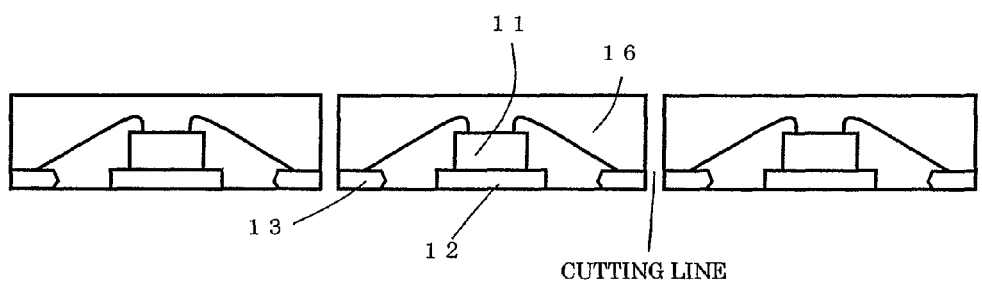
FIG. 7 is a cross-sectional view illustrating the related-art method of manufacturing a resin-encapsulated semiconductor device.
Figure 8:
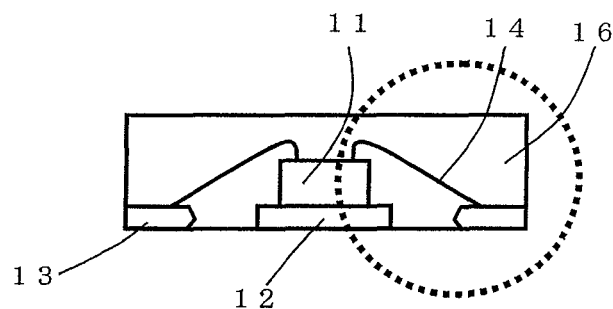
FIG. 8 is a cross-sectional view of the related-art resin-encapsulated semiconductor device.
Figure 9:
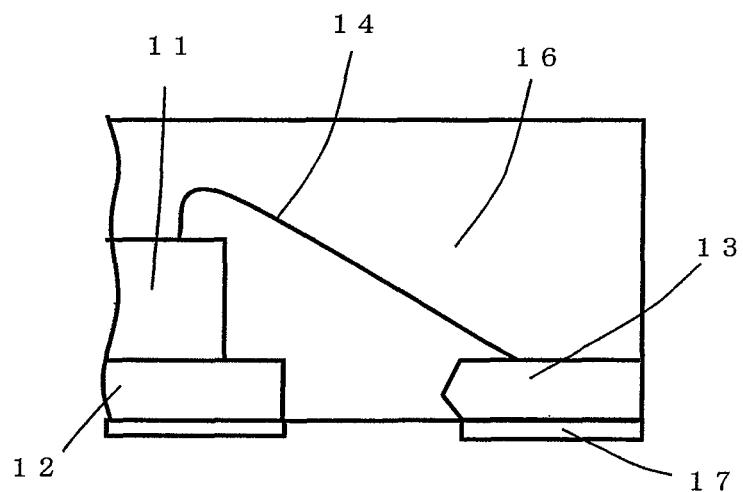
FIG. 9 is a cross-sectional view (lead portion enlarged view) illustrating the related-art resin-encapsulated semiconductor device.
Figure 10:
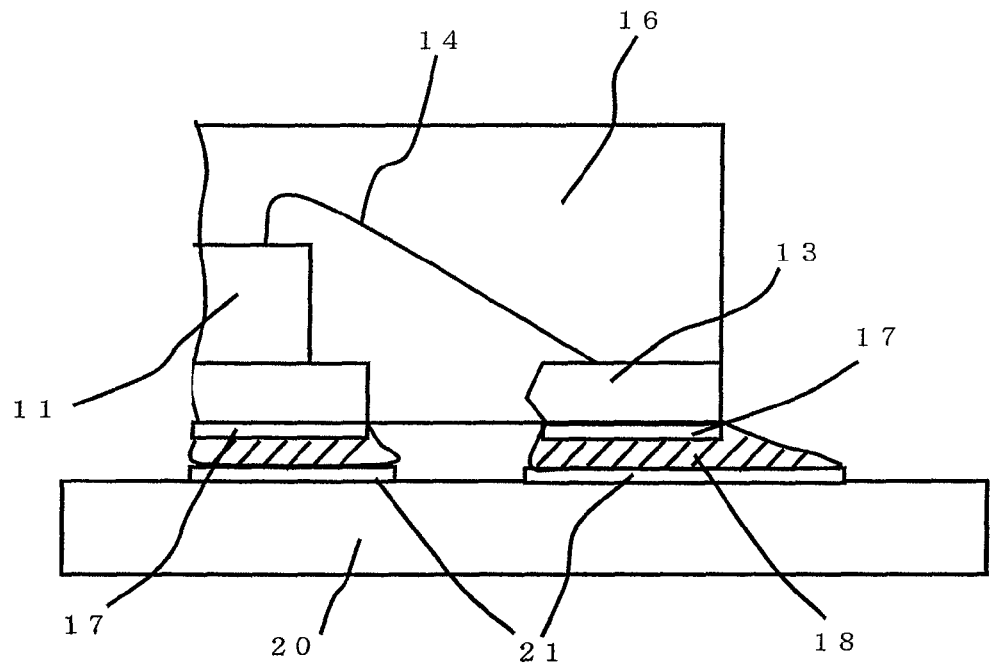
FIG. 10 is a cross-sectional view (mounting state enlarged view) illustrating the related-art resin-encapsulated semiconductor device.
Figure 11:
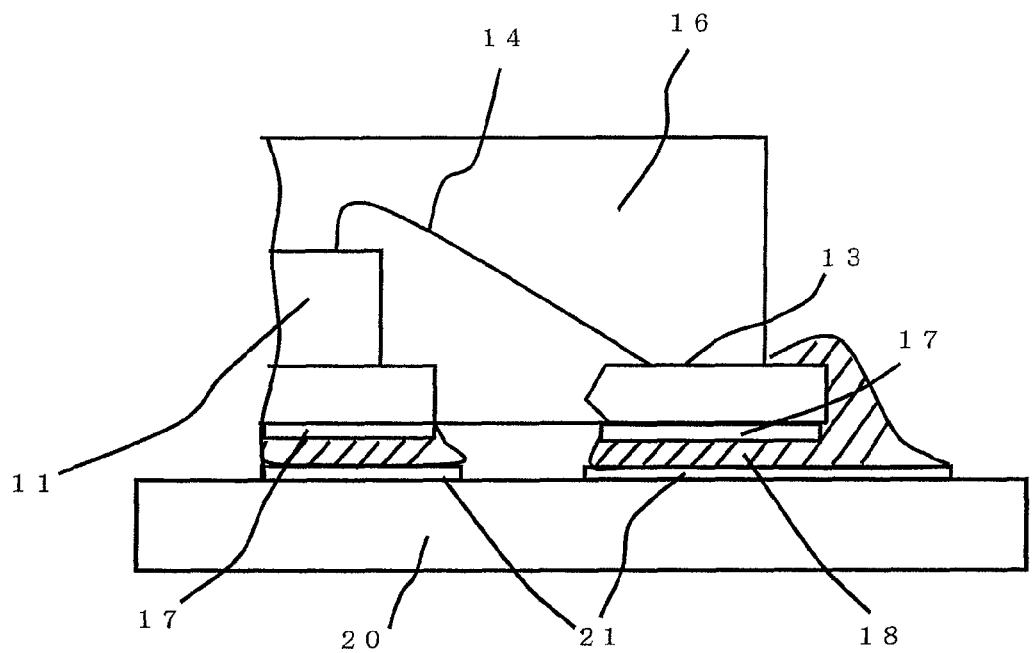
FIG. 11 is a cross-sectional view (mounting state enlarged view) illustrating the related-art resin-encapsulated semiconductor device.

FIG. 4 is a view illustrating a mounting of the resin-encapsulated semiconductor device illustrated in FIG. 3 on a circuit board. A circuit board 20 is provided with a conductive land portion 21, to which the rear surface of the die pad portion 12 and the lead bottom surface part 19a of the outer lead part of the lead portion 13 of the resin-encapsulated semiconductor device are bonded via the plating layer 17 and solder 18. The surface of the plating layer 17 has good wettability with respect to the solder 18, and hence a solder fillet is formed so as to cover the lead bottom surface part 19a, the lead upper end part 19b, and the lead outer surface part 19c. The mounting strength can be improved accordingly, and the mounting reliability can be enhanced. For comparison, FIG. 11 illustrates a state in which a related-art resin-encapsulated semiconductor device without a cutout part is mounted to a board. This example corresponds to a structure in which the lead portion 13 is significantly protruded from the encapsulation resin 16. In contrast, in the case of the resin-encapsulated semiconductor device illustrated in FIG. 4, only a small amount of lead portion 13 is protruded from the outer shape (end surface) of the encapsulation resin 16, which corresponds to a structure that contributes to downsizing of the resin-encapsulated semiconductor device. Further, protrusion of only a small amount of lead portion provides an effective feature also during visual inspection of the resin-encapsulated semiconductor device from above.

In the above, description is made of an example of the lead portion that is bent so that the inner lead part is higher than the outer lead part, but a similar structure can be employed also in a resin-encapsulated semiconductor device of a flat lead type.

Next, a method of manufacturing a resin-encapsulated semiconductor device according to an embodiment of the present invention is described.

First, as illustrated in FIG. 2A, a lead frame made of a copper material is prepared, which includes a plurality of units each including, as one unit, a rectangular die pad portion 12 on which the semiconductor element is to be placed inside the frame and the plurality of lead portions 13 arranged so that leading end portions thereof are opposed to the die pad portion 12. A sealing sheet 15 is attached to the bottom surface side of the lead frame. This sealing sheet 15 is a functional member for protecting the lead portion 13 to prevent the encapsulation resin from flowing around the bottom surface of the lead portion 13, and for exposing the bottom surface of the lead portion 13.

Figure 2B:
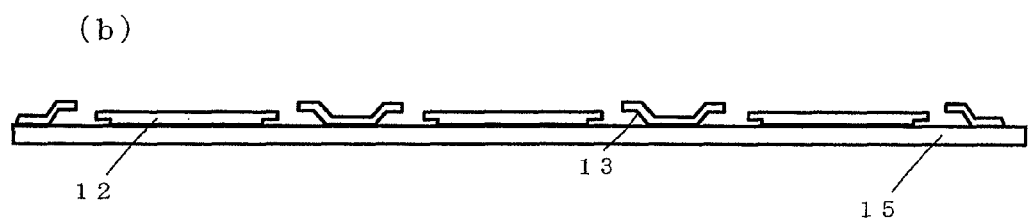

FIG. 2B is a cross-sectional view taken along the line C-C represented in FIG. 2A. The rear surface of the die pad portion 12 and the lead bottom surface part of the outer lead part of the lead portion 13 are adhered onto the sealing sheet 15. The lead portion 13 is bent so that the inner lead part is higher than the outer lead part, and hence the inner lead part is not adhered to the sealing sheet 15.

Figure 2C:
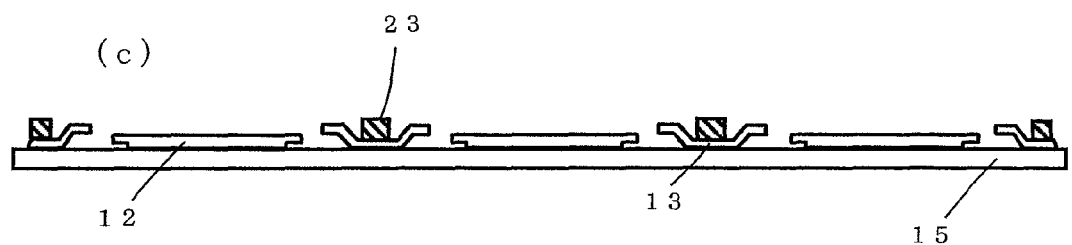

FIG. 2C is a view illustrating a state in which water soluble tape 23 is selectively attached to the upper surface of the outer lead part. In this case, the employed water soluble tape 23 has a rectangular cross section. A resist or a coating material may be used instead of the water soluble tape. The water soluble tape 23 is provided over the entire width of the encapsulation resin 16 represented by the broken lines in FIG. 1.

Figure 2D:
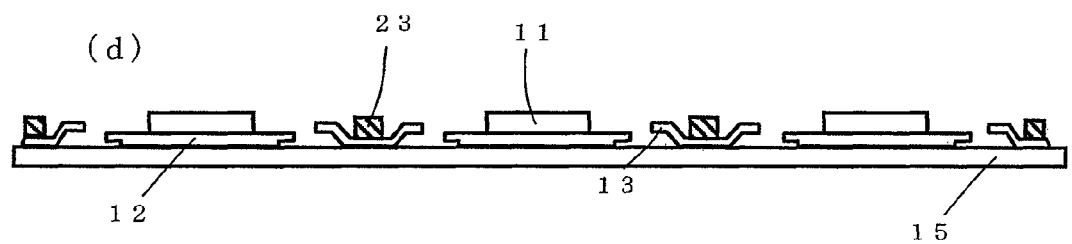
Figure 2E:
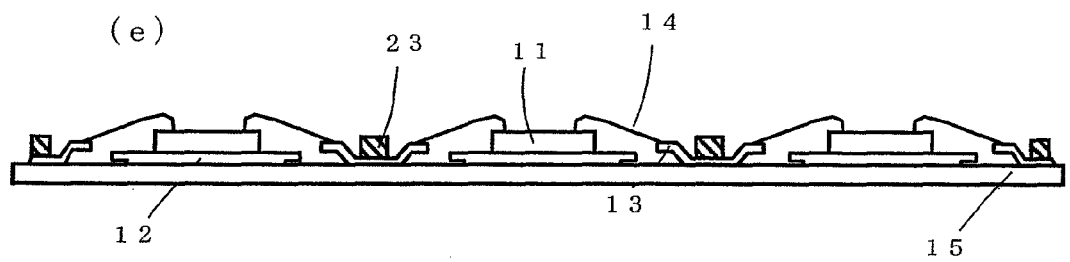

As illustrated in FIG. 2D, each semiconductor element 11 is die-bonded onto the die pad portion 12 of each unit of the lead frame with an adhesive (not shown) such as silver paste. After that, as illustrated in FIG. 2E, by a wire bonding method, an electrode pad (not shown) on the semiconductor element 11 and the inner lead part of the lead portions 13 are electrically connected to each other by the thin metal wires 14.

Figure 2F:
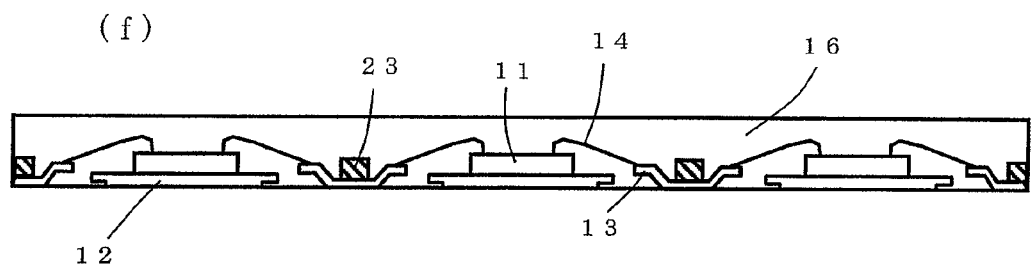

Next, as illustrated in FIG. 2F, by a transfer molding method, with use of the lead frame as an outer circumference, the die pad portion 12, the semiconductor element 11, the inner lead part and a part of the outer lead part of the lead portion 13, and the thin metal wires 14 are encapsulated by the encapsulation resin 16 that is an epoxy resin. Further, the sealing sheet 15 that has been held in close contact with the bottom surface of the die pad portion 12 of the lead frame and the bottom surface of the lead portion 13 is removed. In this state, the die pad portion 12 and the lead portion 13 are exposed from the encapsulation resin 16.

Figure 2G:
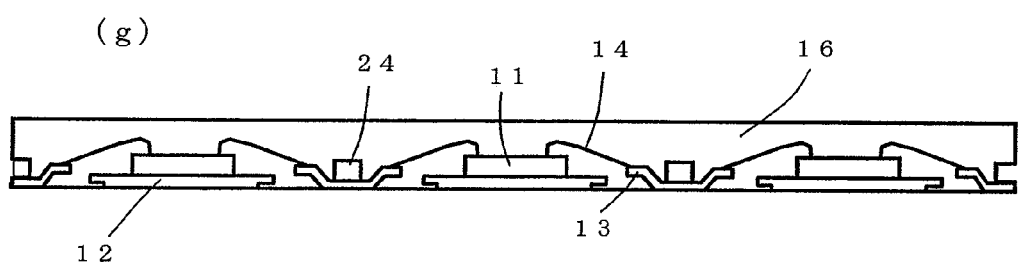

Next, as illustrated in FIG. 2G, the water soluble tape 23 is dissolved by water processing to from a hollow portion 24. The water soluble tape 23 having a rectangular cross section is used, and hence the hollow portion 24 also has a rectangular cross section. When a resist is used instead of the water soluble tape, the resist can be dissolved by processing using a solvent such as isopropyl alcohol to form the hollow portion 24. Also in the case of a coating material, a solvent that can dissolve the coating material can be used to form the hollow portion 24.

Figure 2H:
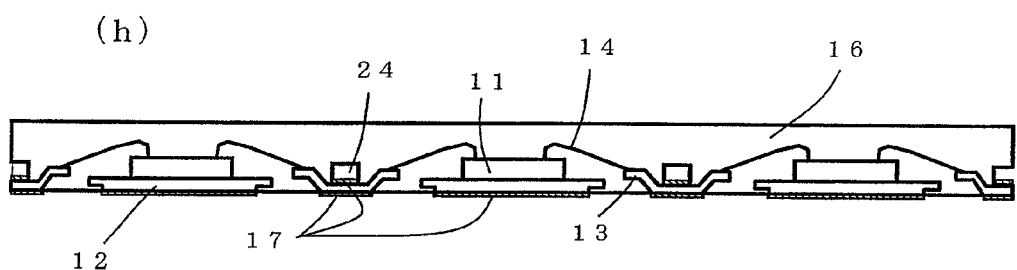

Next, as illustrated in FIG. 2H, the plating layer 17 is formed on the rear surface of the die pad portion 12, the lead bottom surface part of the outer lead part of the lead portion 13, and an upper surface of the outer lead part exposed in the hollow portion 24. In this case, the plating layer having a composition of tin of 100% is formed by an electrolytic plating method. The plating layer 17 may be formed by non-electrolytic plating other than the method using electrolytic plating.

Figure 2I:
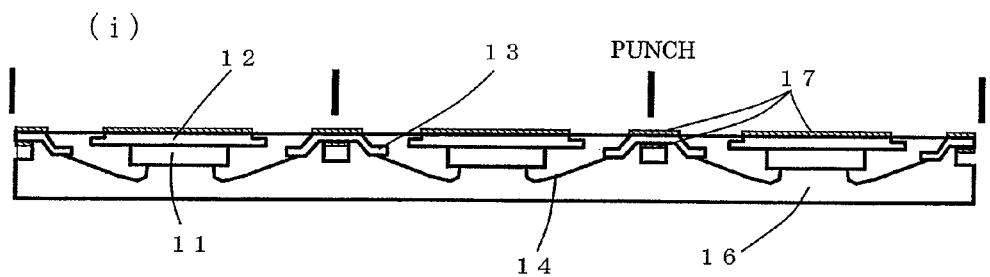
Figure 2J:
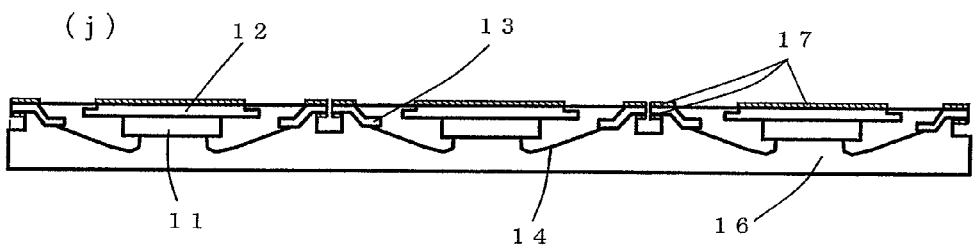

Next, as illustrated in FIG. 2I, the outer lead part of the lead portion 13 is punch-cut with use of a die punch from the lead bottom surface part side of the outer lead part. Then, as illustrated in FIG. 2J, the cutting line thereof forms a narrow groove that reaches the hollow portion 24.

Figure 2K:
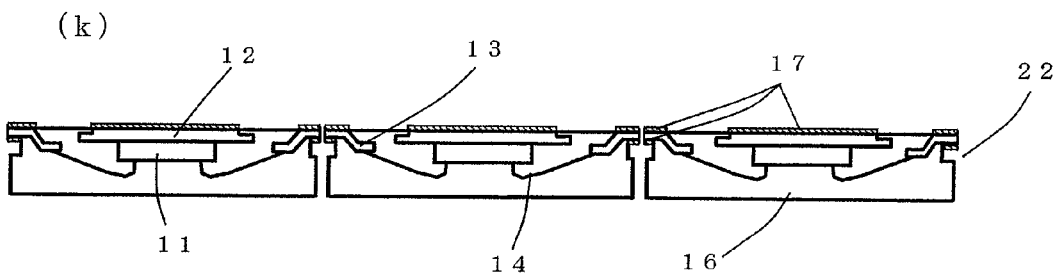

Next, as illustrated in FIG. 2K, cutting is performed by a rotary blade from the encapsulation resin 16 side (lower side in FIG. 2K) that is an opposite side to the side on which punch cutting have been performed, to thereby form a groove that reaches the hollow portion 24. It is desired that the groove width at this time be larger than the narrow groove formed by punch cutting, and smaller than the width of the hollow portion 24.

In this manner, through separation into individual pieces, the resin-encapsulated semiconductor device illustrated in FIG. 3 is obtained. At this time, the hollow portion 24 is divided to become the cutout part 22 provided to the side surface of the encapsulation resin 16. Then, as is understood from the width of the groove formed by punch cutting and the width of the groove formed by the rotary blade, the lead outer surface part 19c at the leading end of the lead portion 13 is slightly protruded with respect to the side surface of the encapsulation resin.

In the above, the embodiment of the case where the cutting width by the rotary blade is larger than the cutting width by the punch cutting is described, but the cutting from the outer lead part side and the cutting from the encapsulation resin side may be performed in the same width, and those cutting widths may be smaller than the width of the hollow portion. In this case, the lead outer surface part is flush with the side surface of the encapsulation resin. In order to realize this structure, the cutting from the outer lead part side and the cutting from the encapsulation resin side may be both performed by a method using punch cutting, or may be both performed by a method using cutting by a rotary blade.

In the description above, the embodiment that uses the water soluble tape 23 having a rectangular cross section is described, and hence the hollow portion 24 also has a rectangular cross section, and the cutout part 22 has a U-shape. As described above, it is also possible to use a resist and a coating material instead of the water soluble tape 23. In this case, the cross section of the selectively arranged resist or coating material is not necessarily a rectangle, and may be a circle or a shape obtained by cutting an ellipse into half. Accordingly, the cross section of the hollow portion 24 may also be a shape obtained by cutting a circle or an ellipse into half, and the cutout part 24 becomes a shape obtained by further dividing those shapes into half or a shape obtained by cutting the circle or the ellipse into quarters.

As described above, in the resin-encapsulated semiconductor device and the method of manufacturing the same according to embodiments of the present invention, the resin-encapsulated semiconductor device has the plating layer 17 on the lead upper end part 19b provided to the lead portion 13, and hence, when the semiconductor device is bonded to the land portion 21 of the circuit board 20 such as a printed board with the solder 18, a solder fillet is formed at the side surface part of the lead portion 13. In this manner, the mounting strength can be improved, and the mounting reliability can be enhanced. Further, a solder fillet with a satisfactory shape is formed on a lead end surface part during board mounting, and hence recognition accuracy at the time of visual inspection of the bonded portion after mounting can be improved. Thus, misrecognition can be prevented.

What is claimed is:

1. A method of manufacturing a resin-encapsulated semiconductor device, comprising:
    preparing one of a frame and an electroformed substrate including a plurality of units each including, as one unit, a die pad portion and a plurality of lead portions arranged so as to be opposed to the die pad portion;
    attaching a sealing sheet to a first surface of the one of the frame and the electroformed substrate;
    forming a soluble film on a second surface of each of the plurality of lead portions, which is on an opposite side to the first surface;
    mounting a semiconductor element to the die pad portion of the one of the frame and the electroformed substrate;
    connecting together the plurality of lead portions and electrodes on a surface of the semiconductor element by thin metal wires;
    encapsulating the die pad portion, the semiconductor element, and the plurality of lead portions by an encapsulation resin and removing the sealing sheet so that a lead bottom surface part of each of the plurality of lead portions is exposed;
    dissolving and removing the soluble film to form a hollow portion in the encapsulation resin;
    immersing the one of the frame and the electroformed substrate into a plating bath to form a plating layer on the lead bottom surface part and a lead upper end part of the each of the plurality of lead portions;
    subjecting the plurality of lead portions to a first cutting from the first surface side to form a first groove that reaches the hollow portion; and
    subjecting the encapsulation resin to a second cutting from the second surface side opposite to the first surface side to separate a resin-encapsulated semiconductor device from the one of the frame and the electroformed substrate.

2. The method of manufacturing a resin-encapsulated semiconductor device according to claim 1, wherein the first cutting comprises punch cutting, and the second cutting comprises rotary blade cutting.

3. The method of manufacturing a resin-encapsulated semiconductor device according to claim 1, wherein the first cutting comprises punch cutting, and the second cutting also comprises punch cutting.

4. The method of manufacturing a resin-encapsulated semiconductor device according to claim 1, wherein the first cutting comprises rotary blade cutting, and the second cutting comprises punch cutting.

5. The method of manufacturing a resin-encapsulated semiconductor device according to claim 1, wherein a cutting width by the second cutting is larger than a cutting width by the first cutting, and is smaller than a width of the hollow portion.

6. The method of manufacturing a resin-encapsulated semiconductor device according to claim 1, wherein a cutting width by the second cutting is the same as a cutting width by the first cutting, and is smaller than a width of the hollow portion.

* * * * *